United States Patent [19]

Schliemann

[11] 3,969,004
[45] July 13, 1976

[54] AIR BEARING PISTON ASSEMBLY FOR SEMICONDUCTOR MASK-TO-WAFER ALIGNER

[75] Inventor: Gerd Schliemann, Saratoga, Calif.

[73] Assignee: The Computervision Corporation, Bedford, Mass.

[22] Filed: Aug. 2, 1974

[21] Appl. No.: 494,111

[52] U.S. Cl. .................................. 308/9; 269/21; 269/75; 308/36.3; 308/DIG. 1
[51] Int. Cl.² ........................................ F16C 7/04
[58] Field of Search ............... 308/9, 36.3, DIG. 1; 29/203 P, 203 V, 569, 583; 269/20, 21, 75; 254/93 R

[56] References Cited
UNITED STATES PATENTS

| | | | |
|---|---|---|---|
| 3,522,761 | 8/1970 | Arneson, Jr. | 308/9 X |
| 3,611,697 | 10/1971 | Greb | 308/9 X |
| 3,672,733 | 6/1972 | Arsenius et al. | 308/9 |
| 3,677,351 | 7/1972 | Geissler | 308/9 X |
| 3,704,920 | 12/1972 | Pan | 308/9 |
| 3,753,604 | 8/1973 | Arsenius | 308/9 X |
| 3,802,086 | 4/1974 | Walker | 308/DIG. 1 |
| 3,891,015 | 6/1975 | Calcagno | 308/DIG. 1 X |
| 3,891,050 | 6/1975 | Kirkpatrick et al. | 308/DIG. 1 X |

Primary Examiner—Robert J. Spar
Assistant Examiner—Randolph A. Reese
Attorney, Agent, or Firm—Richard J. Birch

[57] ABSTRACT

An air bearing piston assembly for semiconductor mask-to-wafer aligner which utilizes a plurality of air bearings to produce a very low friction and a very predictable force system for bringing a mask into contact and level with a semiconductor wafer. Two small driver pistons are employed to move a main piston. An outside air bearing between a rotation clamp ring and the main piston and an inside air bearing between a piston guide and the main piston produce an almost frictionless system. A third air bearing is established between a leveling ball and the ball table so that the wafer with the chunk can level accurately with a minimum of force against the mask.

7 Claims, 10 Drawing Figures

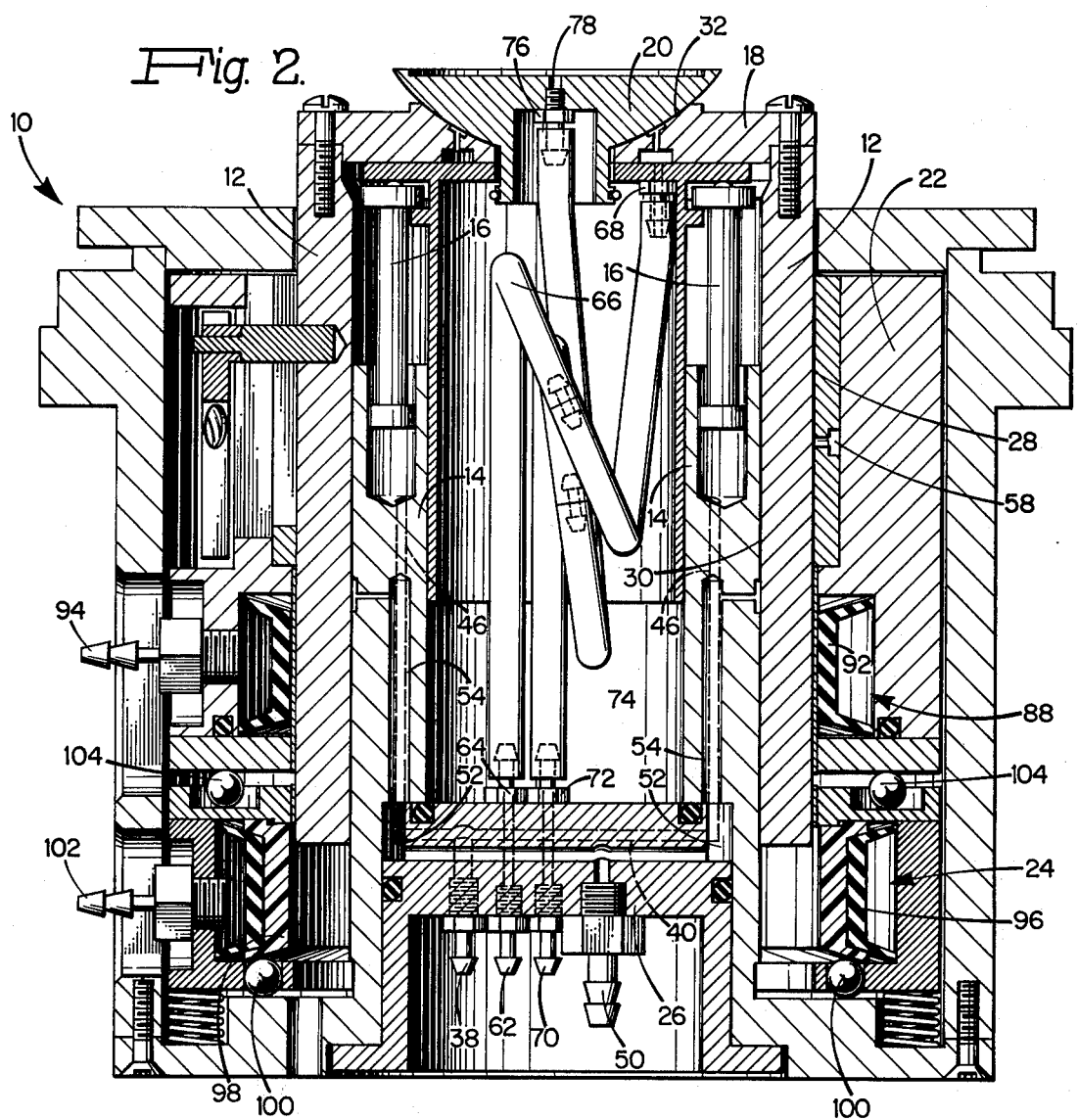
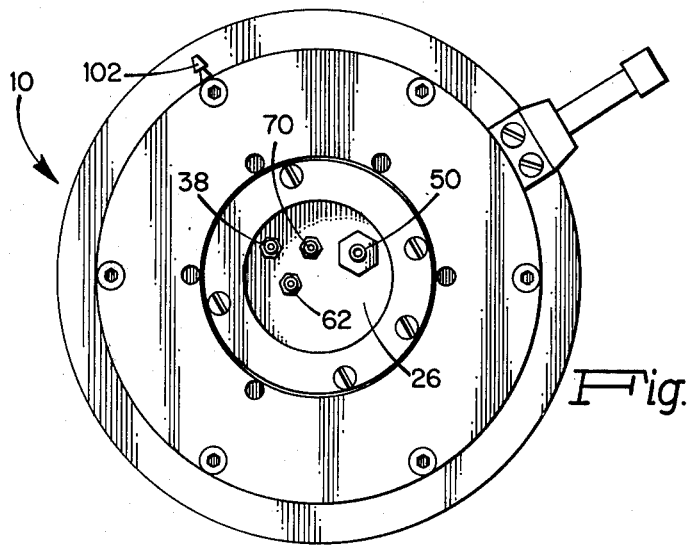

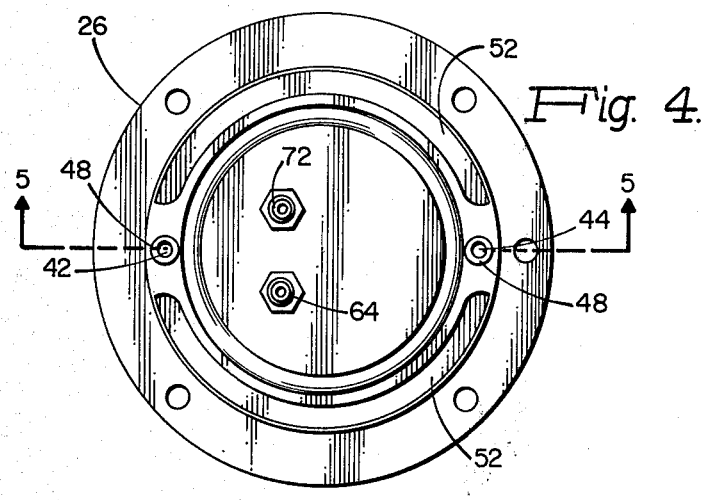
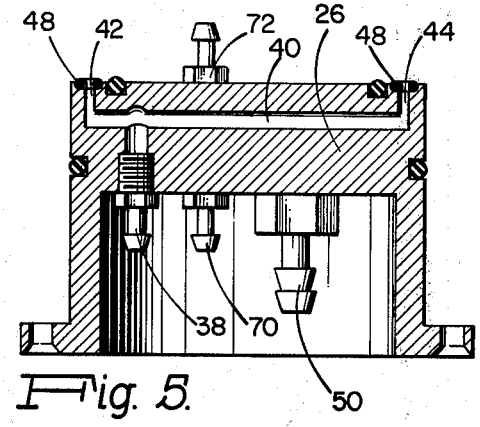
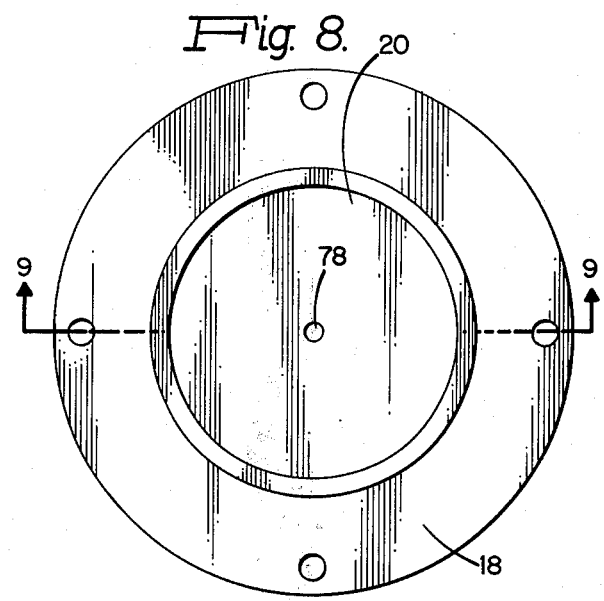
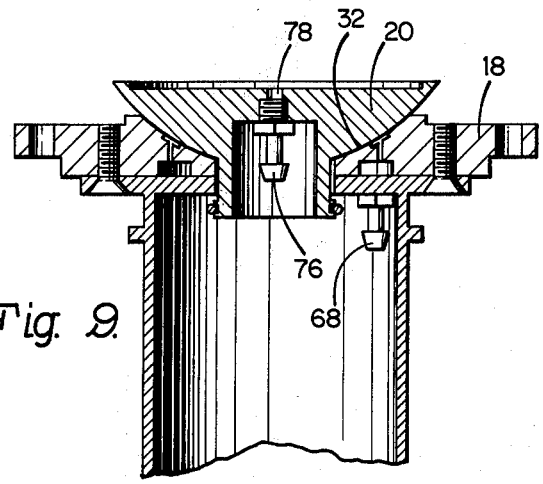

AIR BEARING PISTON ASSEMBLY FOR SEMICONDUCTOR MASK-TO-WAFER ALIGNER

BACKGROUND OF THE INVENTION

The present invention relates to semiconductor mask-to-wafer aligners in general and, more particularly to an air bearing piston assembly for such aligners.

The prior art aligners had pistons or lift mechanisms which comprised of either two, oil-lubricated, metal sliding surfaces or cylinders riding on a ball bearing system. These aligners had a greater than 1 lb. force between the mask and the wafer and the friction in the lifter systems did not significantly change the force between the mask and the wafer.

The free body force equation of the piston is: F (applied) = F (mask-to-wafer) + F (friction) + F (weight of piston). It can be seen from this equation that F (mask-to-wafer) remains relatively constant (even if the friction force varies 2–1) as long as F (mask-to-wafer) is much greater than F (friction). As long as F (mask-to-wafer) remains in excess of 1 lb. this is true.

In recent years, as the size of integrated circuits increased, the damage done to the mask by the wafer has become more and more important. It has been found that the damage can be decreased considerably if the force between the mask and the wafer is made very low.

It is accordingly a general object of the present invention to provide an improved system for contacting and leveling the wafer to the mask in a semiconductor mask-to-wafer aligner.

It is a specific object of the invention to produce a microforce air bearing piston assembly for such aligners.

It is another object of the invention to provide an air bearing piston assembly which produces a very light pressure between the wafer and the mask during the leveling, contacting and exposing cycles of the aligner.

It is a feature of the invention that the air bearing piston assembly has a very low friction and can produce a very predictable force.

These objects and other objects and features of the invention will best be understood from a detailed description of a preferred embodiment thereof, selected for purposes of illustration and shown in the accompanying drawings, in which:

FIG. 2 is a view in cross-section taken along line 2 — 2 of FIG. 1 showing the major components of the air bearing piston assembly;

FIG. 3 is a bottom view of the air bearing piston assembly;

FIG. 4 is a plan view of the air bearing piston assembly manifold;

FIG. 5 is a view in cross-section of the manifold taken along line 5 — 5 in FIG. 4;

FIG. 9 is a view in cross-section of the ball table assembly taken along line 9 — 9 of FIG. 8; and, FIG. 10 is a diagrammatic view in block and schematic form illustrating the pressure and vacuum components of the air bearing piston assembly.

Figure 1:
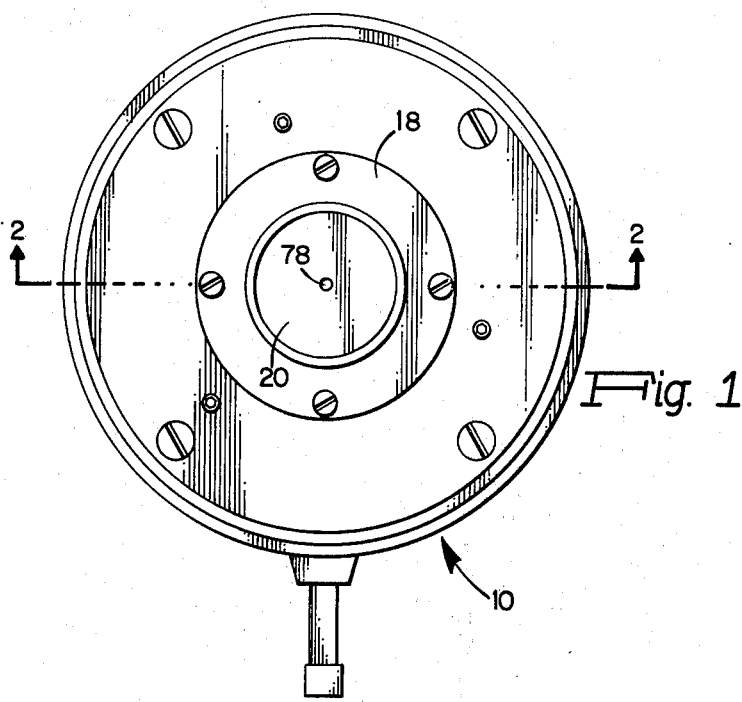
FIG. 1 is a plan view of an air bearing piston assembly constructed in accordance with the present invention.

Turning now to the drawings, the major components of the air bearing piston assembly of the present invention can best be seen by referring to FIGS. 1 — 3. The air bearing piston assembly, indicated generally by the reference numeral 10, comprises: a moveable main piston 12; a piston guide 14; two driver pistons 16 that are mounted on piston guide 14; a ball table 18 which is secured to the main piston 12; a levelling ball 20 positioned within the ball table 18; a rotation clamp ring assembly 22 for clamping the main piston; a lift ring assembly 24 for vertically positioning the rotation clamp ring assembly 22; a manifold assembly 26; an outside air bearing 28 formed between the rotation clamp ring assembly 22 and the outside surface of the main piston 12; an inside air bearing formed between the inside surface of the main piston 12 and the piston guide 14; and, a levelling air bearing 32 formed between the surface of the ball table 18 and the ball 20.

The movement of the main piston 12 is controlled by the action of the two driver pistons 16 which are spaced apart by 180°. Pressure and a vacuum are selectively supplied to the driver pistons 16 from suitable pressure and vacuum sources 34 and 36, respectively, shown diagrammatically in FIG. 10.

Looking at FIGS. 2 and 5, driver piston hose-fitting 38 is mounted on the manifold assembly 26. The hose fitting is gaseously coupled to a channel 40 in the manifold assembly which terminates in two outlet channels 42 and 44, which in turn are gaseously coupled to corresponding channels 46 in the main piston guide 14. The channels 46 terminate in gaseous communication with the driver pistons 16. O-rings 48 are provided in each of the outlet channels 42 and 44 to provide a gas tight seal.

A second hose fitting 50 is mounted on the piston assembly manifold 26 to provide a gaseous communication path to both the outside and inside air bearings 28 and 30, respectively. As shown in FIGS. 2, 4 and 5, the hose fitting 50 communicates through a channel in the manifold 26 to two circumferential grooves 52 cut into the upper surface of the manifold. These grooves are in gaseous communication with corresponding bores 54 formed in the main piston guide 14. The bores 54 terminate at the interface between the outer surface of the main piston guide and the inner surface of the main piston itself. The inside air bearing 30 is formed when pressure is applied from pressure source 36 through hose fitting 50 to this interface.

Figure 6:
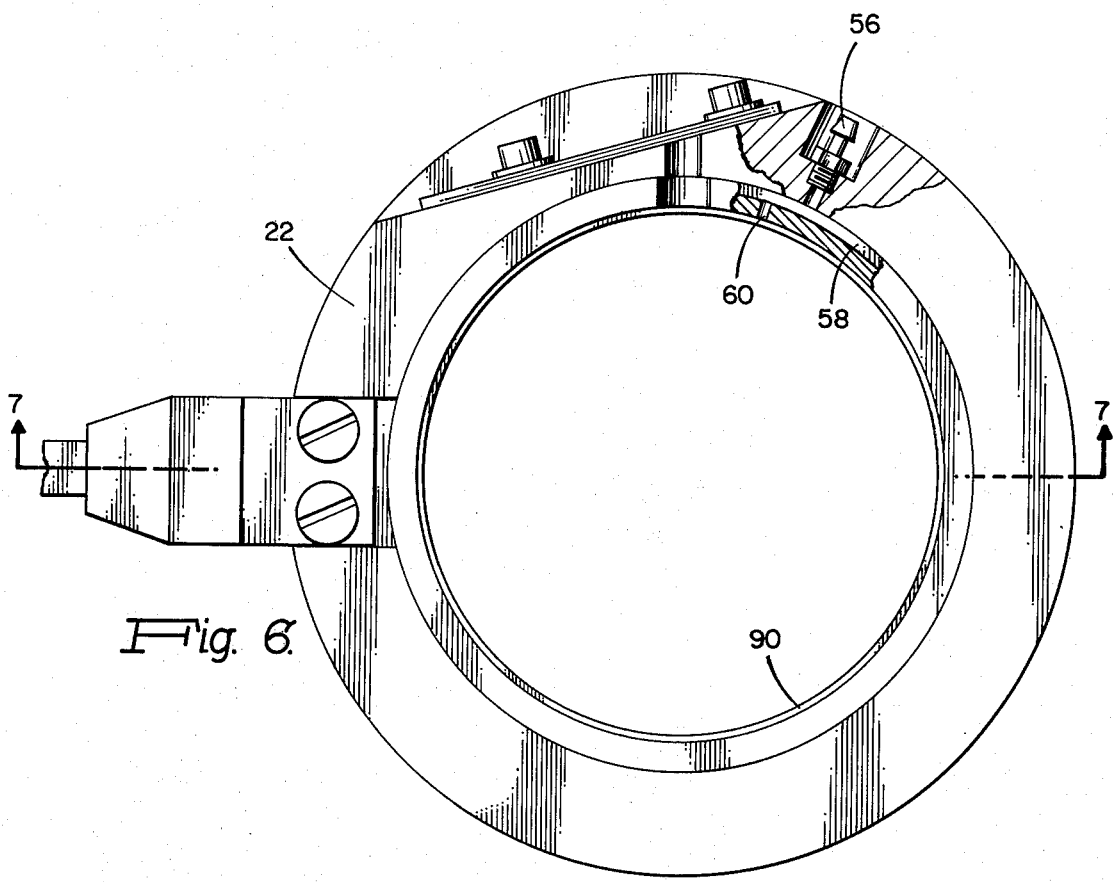
FIG. 6 is a plan view of the rotation clamp ring assembly.
Figure 7:
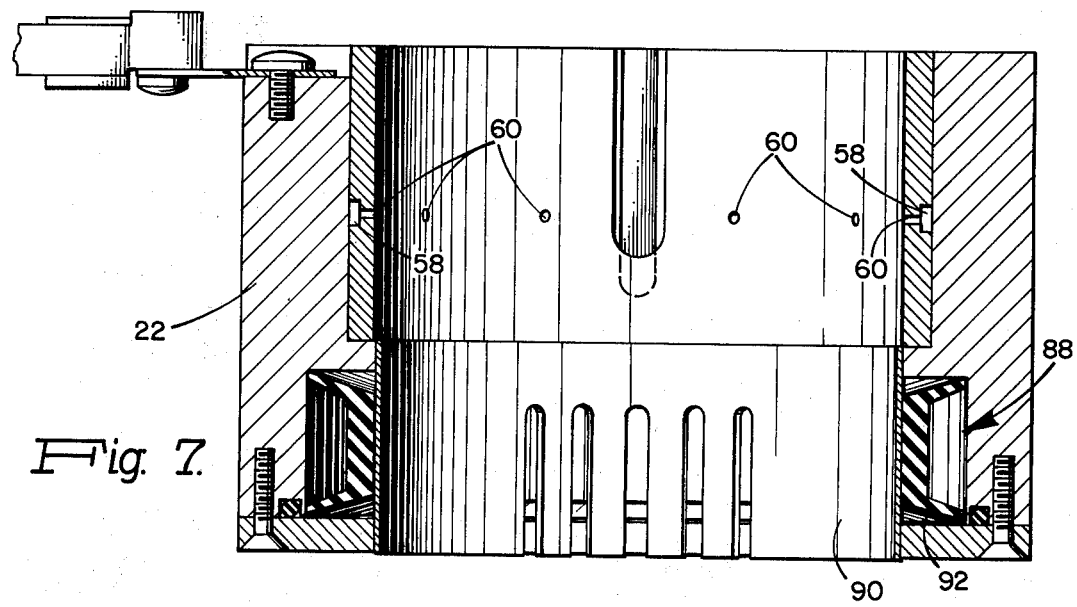
FIG. 7 is a view in cross-section of the rotation clamp ring assembly taken along line 7 — 7 in FIG. 6; and, FIG. 8 is a plane view of the ball table assembly.

The outside air bearing 28 between the outer surface of the main piston 12 and the rotation clamp ring assembly 22, is formed by applying air pressure through a hose fitting 56 located on the clamp ring assembly, as shown in FIG. 6. The hose fitting 56 is in gaseous communication with an air bearing channel 58 formed in the rotation clamp ring assembly. The air channel 58 terminates in a plurality of air bearing supply ports 60, as shown in FIG. 7. Thus, when air pressure is applied to the hose fitting 56, the outside air bearing 28 is formed between the main piston and the rotation clamp ring assembly.

It has all ready been mentioned that the air bearing piston assembly 10 is designed to produce a very light pressure between the wafer and the mask (not shown) during the levelling contacting and exposing cycles of the aligner. This greatly increases the life of the mask by many times due to the gentle treatment of the mask.

The force between the wafer and the mask is as low as one-half of an ounce. This is established by means of the small diameter of the driver piston 16. Preferably, the diameter is on the order of 0.125 inch. The two driver pistons 16 provide the upward force necessary to move the main piston, the wafer chuck and the wafer into contact with the mask. Since the driver pistons exert a very small force, typically equal to the weight of the moveable piston plus 0.5 ounces, and in addition must overcome the friction of the main piston 12, the main piston has to be almost frictionless (friction much less than 0.5 ounces). The goal of an almost frictionless main piston is achieved through the use of the outside air bearing 28 between the rotation clamp ring 22 and the main piston 12 and the inside air bearing 30 between the main piston guide 14 and the main piston itself. The physical clearance for the outside and the inside air bearings 28 and 30, respectively, is 0.0002 – 0.0003. This small clearance produces the requisite degree of stability and stiffness combined with low friction on the main piston.

The levelling air bearing 32 and its associated structural components can best be seen from an examination of FIGS. 2, 8 and 9. The levelling air bearing 32 is formed between the surfaces of the ball table 18 and the levelling ball 20. This bearing is provided so that the wafer with the chuck will level accurately with a minimum force against the mask. After levelling, the air bearing changes to vacuum to lock the ball in place.

Figure 10:
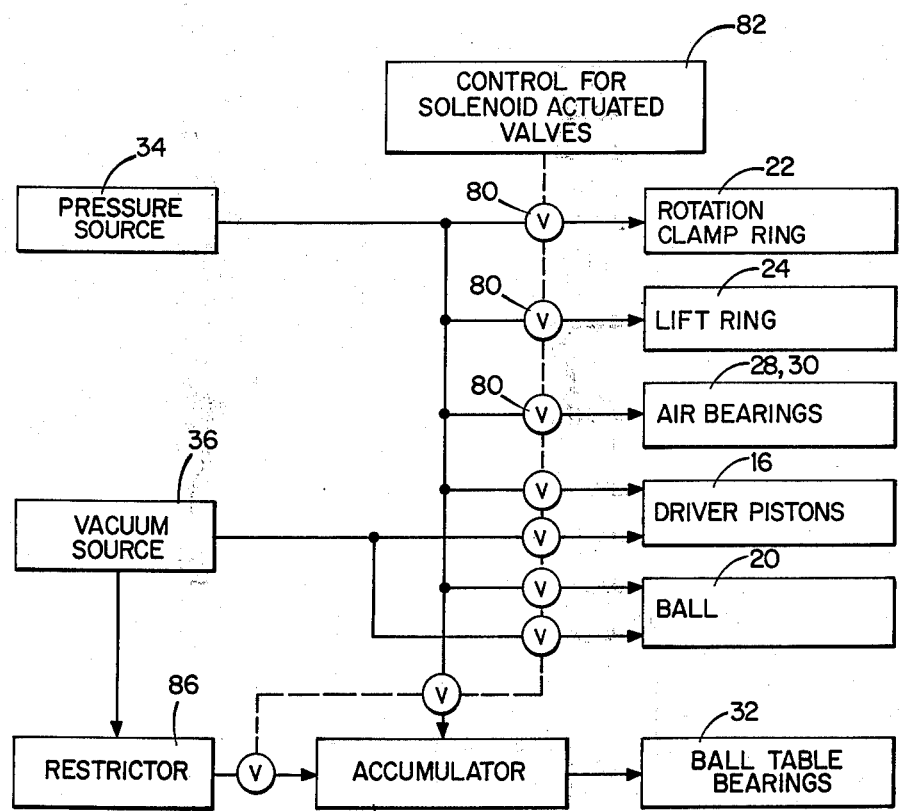

The levelling air bearing 32 is selectively, gaseously coupled to the pressure and vacuum sources 34 and 36 (as depicted diagrammatically in FIG. 10). Inlet and outlet hose fittings 62 and 64 are provided on the manifold assembly 26. A flexible hose 66 is connected between the manifold outlet hose fitting 64 and a corresponding hose fitting 68 on the ball table 18. The hose fitting 68 is in gaseous communication with the interface between the ball table 18 and levelling ball 20.

A second pair of inlet and outlet hose fittings 70 and 72, respectively, are provided on the manifold 26 with the outlet fitting being gaseously coupled through a flexible hose 74 to another hose fitting 76 on the levelling ball 20. The ball hose fitting 76 is in gaseous communication through a bore 78 with the surface of the levelling ball. The central location of bore 78 permits the operation of vaccum to the backside of the wafer thereby eliminating forces which tip the ball.

Having discussed the major components of the air bearing piston assembly of the present invention, the operational cycle of the assembly will now be discussed. FIG. 10 illustrates in diagrammatic form the pneumatic connections of the various components of the air bearing piston assembly to the pressure and vacuum sources 34 and 36. The selective coupling of the pressure and vacuum sources to the associated components of the air bearing piston assembly is provided by means of a plurality of solenoid actuated valves indicated generally by the reference numeral 80. Electric actuation signals for the valves 80 are provided by a suitable control means 82 in a manner well known to those skilled in the art.

Clean and dry air (or other gas) is applied to the outside and inside air bearings 28 and 30 at all times to make the main piston 12 float. However, in view of the small physical clearances between the piston and the piston guide, the piston is laterally stiff so that the wafer cannot move laterally with respect to the mask. Depending upon the chuck weight, a very accurate and stable pressure is applied to both driver pistons 16. This causes the main piston to rise, lifting the chuck gently out of the turntable (not shown) and carrying it in an upwardly direction toward the mask. At this point, the chuck sits on top of the levelling ball 20, which is locked by vacuum, until the chuck with the wafer arrives against the mask. The chuck is also supplied with vacuum through the levelling ball bore 78, at this time to hold the wafer in place. The vacuum on the levelling ball is than turned to pressure, making the chuck float so that it can level the wafer to the mask.

After a suitable delay, the pressure is changed back to a vacuum in order to lock the chuck into a level position. This change from pressure to vacuum must happen extremely smoothly so that the main piston can compensate for the air bearing gap between the levelling ball and the ball table surface because this gap is eliminated as the pressure changes to a vacuum. Thus, as the air bearing is eliminated due to the collapsing of the bearing by the application of vacuum, the piston moves upwardly to eliminate the gap.

A pneumatic delay chamber or accumulator 84 is used to change the air bearing on the levelling ball slowly back to vacuum. Since the accumulator contains the air bearing pressure prior to the application of the vacuum, and since the vacuum is applied through a resistor fitting 86, the air bearing collapses slowly, allowing time for the piston to take up the gap.

At this point, the rotation clamp ring assembly 22 is floating around the main piston by the outside air bearing 28. The rotation clamp ring is locked around the piston and becomes a part of the piston by means of a pressure actuated clamp indicated generally by the reference numeral 88 in FIG. 7. The pressure actuated clamp 88 comprises a split metal separation ring 90 which is squeezed against the main piston by means of a pressure actuated "inner tube" 92. Pressure for the inner tube 92 is supplied from the pressure source through a hose fitting 94 as shown in FIG. 2. With the rotation clamp ring assembly now firmly locked to the main piston, the piston can be rotated to provide the desired degree of $\theta$ movement of the supported wafer without any X, Y translation. The clamp ring assembly thus provides a coupling to the piston holding wafer which is absolutely frictionless when disengaged and which can be rotated without any X, Y translation when engaged.

After locking the clamp ring assembly, the driver piston 16 changes to vacuum which causes the main piston 12 to move downwardly thereby moving the wafer away from the mask (separation). The separation distance is adjustable in the air bearing piston assembly by means of the lift ring assembly 24. Looking at FIG. 2, the lift ring 24 assembly comprises a pressure actuated inner tube 96 and a beveled ring 98. The beveled portion of ring 98 rides on a staked ball 100, so that when pressure is applied to the inner tube 96 through base fitting 102 the beveled ring 98 will ride up on ball 100. This upward movement of the beveled ring 98 is transmitted through ball 104 to the rotation clamp ring assembly 22. Since the rotation clamp ring assembly at this point is locked to the main piston, the main piston in turn is adjusted by movement of the lift ring assembly 24. The separation adjustment preferrably ranges from 0.00 to 0.004 inch. With the piston in the separation mode, the alignment of the wafer to the mask is done in a conventional manner.

The driver piston 16 is now changed back from a vacuum to pressure to bring the main piston into the contact mode. Since alignment accuracy can be as close as 0.5 microns, it is important that the piston move absolutely vertically to bring the wafer into contact with the mask. This achieved by the inside air bearing 30 between the carefully matched main piston and the piston guide.

Once in the contact position, the wafer is exposed through the mask and then returned to the turntable in the following manner. The rotation clamp ring assembly 22 unlocks to free the main piston, allowing it to go back down. The driver piston 16 change back to vacuum thereby pulling the main piston down away from the mask. When the chuck goes down into the turntable, vacuum to the chuck (which is supplied by the levelling ball through the center bore 78) changes to an air puff. The air puff makes it possible to disengage the levelling ball from the chuck so that the ball can go back further down in order to clear the turntable. This completes the end of one cycle.

Having described in detail a preferred embodiment of my invention, those skilled in the art will appreciate the advantages and features of using an air bearing piston to level and contact a semi-conductor wafer with a mask. The air bearing piston assembly can be viewed as an air transducer in which the air pressure is translated to wafer to mask force and in which a pneumatic capacitor is employed to slowly collapse the levelling ball air bearing while the piston takes up the bearing distance.

Those skilled in the art also will appreciate that numerous modifications can be made to the invention without departing from the scope thereof as defined in the appended claims.

What I claim and desire to secure by Letters Patent of the United States is:

1. In a semiconductor mask-to-wafer aligner, an air bearing piston assembly for raising a semiconductor wafer to a mask comprising:
    movable piston means;
    a ball table mounted on said piston means with a hemispherical leveling ball movably positioned in said ball table;
    means for establishing an air-bearing between said ball and ball table; means for establishing either a vacuum or a pressure at the central portion of the flat surface of the hemispherical leveling ball;
    means for guiding said piston means;
    means for establishing an air bearing between said piston means and said piston guide means; and,
    means for moving said piston means.

2. The apparatus of claim 1 further comprising means for slowly and smoothly eliminating the air bearing between said levelling ball and said ball table.

3. The apparatus of claim 2 wherein said means for eliminating the air bearing between the levelling ball and the ball table includes means for establishing a vacuum there between.

4. The apparatus of claim 3 wherein said vacuum is established through a pneumatic delay means.

5. The apparatus of claim 3 further comprising means for moving said piston means while said air bearing is slowly and smoothly eliminated to bring said ball table into contact with the levelling ball when the air bearing there between is eliminated.

6. In a semiconductor mask-to-wafer aligner, an air bearing piston assembly for raising a semiconductor wafer to a mask comprising:
    movable piston means;
    means for guiding said piston means; means for establishing an air bearing between said piston means and said piston guide means; means for moving said piston means; and,
    engagable coupling means for coupling to the movable piston means, said coupling means being frictionless when disengaged and when engaged permits rotation of said piston means without X, Y translation.

7. The apparatus of claim 6 wherein said movable piston means has a cylindrical portion and wherein said coupling means comprises a contractable ring positioned around but not touching the cylindrical portion of said piston means and means for contacting said ring sufficiently to clamp said ring to said cylindrical portion of the piston means.

* * * * *